United States Patent [19]

Friedman

[11] Patent Number: 6,078,845
[45] Date of Patent: *Jun. 20, 2000

[54] APPARATUS FOR CARRYING SEMICONDUCTOR DEVICES

[75] Inventor: Daniel J. Friedman, San Francisco, Calif.

[73] Assignee: Schlumberger Technologies, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/756,296

[22] Filed: Nov. 25, 1996

[51] Int. Cl.⁷ .................................................. G06F 19/00
[52] U.S. Cl. ...................... 700/104; 700/112; 700/115; 700/116; 700/226; 438/166; 438/907; 438/925
[58] Field of Search ..................... 438/106, 907, 438/407, 205, 925; 414/231, 235, 243, 783, 935–941; 29/25.01; 700/188, 106, 107, 110–112, 115, 116; 716/224–229, 8, 9; 705/10, 28

[56] References Cited

U.S. PATENT DOCUMENTS

| | | | |
|---|---|---|---|
| 5,305,221 | 4/1994 | Atherton | 364/468 |
| 5,372,471 | 12/1994 | Wu | 414/786 |
| 5,625,816 | 4/1997 | Burdick et al. | 395/614 |
| 5,628,828 | 5/1997 | Kawamura et al. | 118/719 |
| 5,642,307 | 6/1997 | Jernigan | 364/103 |
| 5,668,056 | 9/1997 | Wu et al. | 438/106 |

OTHER PUBLICATIONS

C. H. Fancher, *Smart Cards,* pp 40–45, Scientific American, Aug. 1996.

*Primary Examiner*—Paul P. Gordon
*Assistant Examiner*—Ramesh Patel

[57] ABSTRACT

This invention pertains to the embedding of a information storage device within, or attached to, the carriers used to transport work in progress from step to step in the semiconductor manufacturing process. The carrier can be a tray having sites for several semiconductor dies, tubes for carrying several dies together, lead frames, wafer cassettes or individual die sockets. The information storage device can be formed integrally with the carrier or formed separately and attached or secured to the carrier.

15 Claims, 8 Drawing Sheets

APPARATUS FOR CARRYING SEMICONDUCTOR DEVICES

FIELD OF THE INVENTION

This invention describes a system, methods and apparatus for storing information such as the lot number, wafer number and individual device identification as well as process information and other unit-specific data within the carriers used to transport semiconductor devices through their manufacturing process or within the IC package itself.

BACKGROUND OF THE INVENTION

The feedback of test and inspection results data is of critical importance for process diagnostics and increasing yield in a semiconductor manufacturing line. To be most effective, data relating to a particular semiconductor device must always be traceable to that devices lot, wafer within the lot and location on the specific wafer. However, once wafers are tested and the good die removed, the ability to maintain traceability of each of the individual die, throughout the remainder of the process, is an extremely difficult task that has, in the past, required manual intervention.

Previous approaches for associating data with devices during the semiconductor manufacturing process have included the following two methods:

1) Paper travelers are attached to device carriers, which are then hand carried through the process and the paper traveler manually updated at each step; and 2) Individual device lead frames and packages are marked with a unique serial number as soon as the chip is installed, the serial number may be read at each processing step and the results manually, or automatically, recorded after which the device is re-marked before shipment. Such a mark might be a two-dimensional array similar to a bar code.

The first method is inherently unreliable, relying as it does on manual recording of information, and is prone to error or improper use. The paper travelers are easily detached from the carriers or lost in the manufacturing process. The second method requires additional steps in the manufacturing process and does not provide a solution for devices that are sold as bare die.

The use of electronic memory devices is well known in many applications. In particular, the use of such devices in the form of semiconductor integrated circuits (ICs) embedded in cards for carrying financial or other information has increased in recent years. Such cards, being of the same size and shape as magnetic stripe cards such as those used for credit cards or the like, have an integrated circuit embedded within the body of the card and some means for the IC to communicate with a reader so as to exchange data. In their simplest form, IC cards or "smart cards" as they are known, include a simple memory device which provides information to a reader on demand. More sophisticated devices also allow data to be written to the memory and can even perform basic data processing in the card itself. The card reader and or read/write device contacts the IC via electrical contacts on the surface of the card ("contact") or via an r.f. inductive link, there being an inductive loop formed inside the card which can provide power to the IC and send and receive data passed between the IC and read/write device ("contactless"). The technology required to perform these activities is well known and a summary of this can be found in the article "Smart Cards" by Carol H. Fancher published in Scientific American, August 1996, Vol. 275, No. 2, pp 40–45.

The present invention resides in the realization that the integration of "smart card" technology into the semiconductor manufacturing process can not only overcome the problems described above, but can also provide information in sufficient quantity and at appropriate times to allow better management of the manufacturing process.

It is an object of the present invention to provide a system in which such integration can be realized.

SUMMARY OF THE INVENTION

This invention pertains to the embedding of an information storage device within, or attached to, the carriers used to transport work in progress from step to step in the semiconductor manufacturing process. The carrier can be a tray having sites for several semiconductor dice/devices, tubes for carrying several devices together, lead frames, wafer cassettes or individual die sockets. The information storage device can be formed integrally with the carrier or formed separately and attached or secured to the carrier. An alternative embodiment of the invention includes the information storage device embedded in or attached to the IC package.

This information storage device includes a data memory and may be any form of semiconductor component capable of being written to, and read from by apparatus located in manufacturing equipment, or along manufacturing lines. The information storage means also includes means for allowing communication between the data memory and read/write apparatus. This can be contact or non-contact as desired, and techniques commonly used in smart card systems are preferred.

The data that may be stored in the data memory device may include, but is not limited to: lot identification, wafer identification for each device in the carrier, the original location on the wafer for each device in the carrier, identification of specific process equipment used to manufacture each device, date and time stamps, operator identification for each process step, process step test or inspection results for each device, process steps completed, remaining life of the carrier and other data pertinent to each individual wafer, die, or device, in the carrier. Where there are several discrete sites in the carrier, each of which can hold one device, the data is stored so as to be specific to each site and hence each individual device.

A system according to the invention comprises a read/write terminal at individual pieces of manufacturing or testing equipment which contacts the information storage device and provides data to the data memory. The reader can also read the data in the memory and transmit it to a central data processor together with its own data to allow control and evaluation of the manufacturing process. The provision of a data memory for each carrier allows the carrier to be moved between physically remote pieces of processing equipment while still retaining the information concerning the manufacturing processes applied to each of the devices. This is particularly useful when the processes are conducted in different buildings which may even be in different countries.

A system according to the present invention provides a method and apparatus for automatically storing the identification and process data within the carriers used to transport semiconductor devices through the manufacturing process. By enabling the automatic traceability of individual device inspection and test results to the specific lot, wafer and die location, this will provide semiconductor manufacturers with a method to decrease the time necessary to bring a new device, or process, up to volume manufacturing standards while increasing process yield. Additional benefits will be derived through the enhanced ability to maintain tight process control and through the ability to trace field failure returns to the process step that may have introduced a defect.

DESCRIPTION OF THE PREFERRED EMBODIMENT

Figure 1:
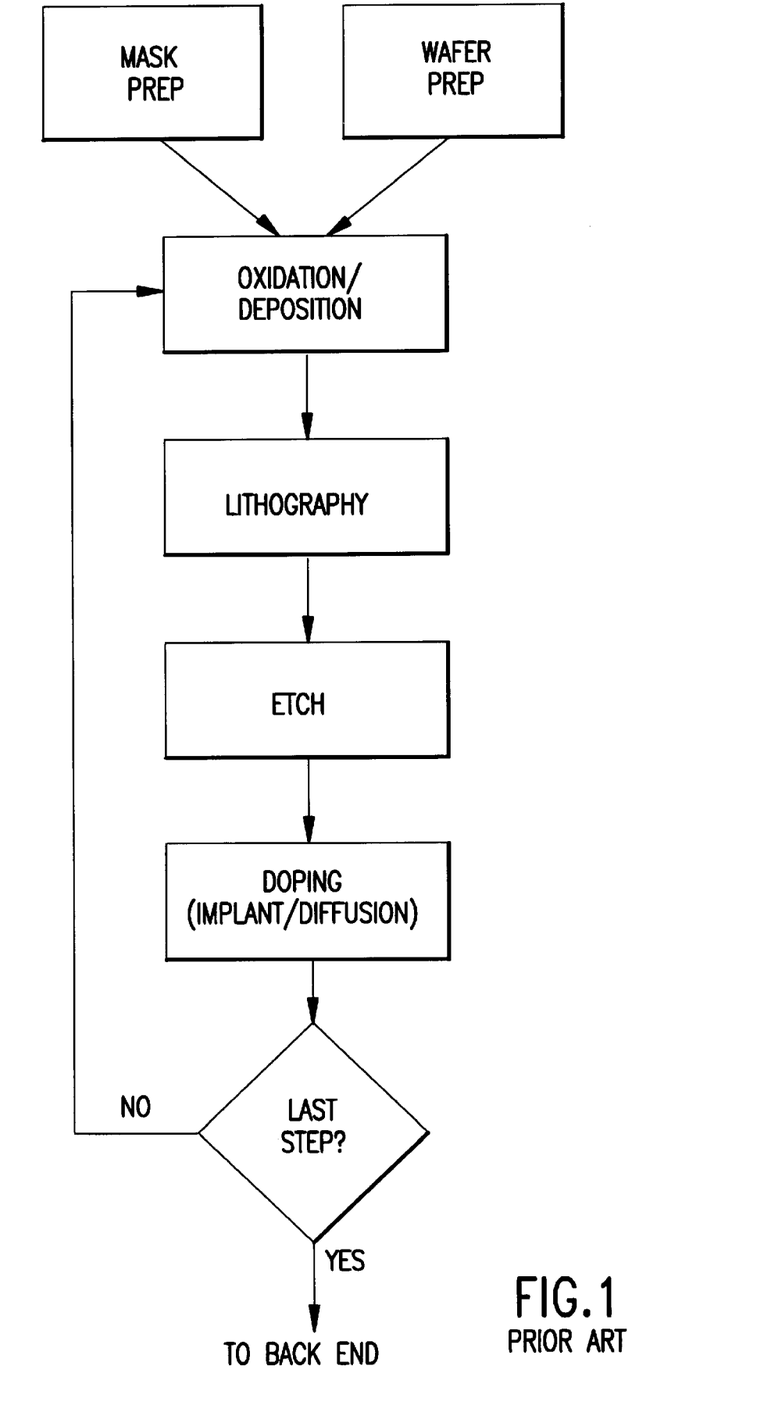
FIG. 1 shows a flow diagram summarizing the front-end of the semiconductor manufacturing process.

Semiconductor devices are manufactured through the use of a photo-chemical process comprising up to several hundred discrete steps. These devices are fabricated on wafers that may be up to 300 mm in diameter. Each wafer may contain hundreds, or thousands, of units, called die. During the photo-chemical phase of the process, referred to as the "front end", groups of wafers, called "lots", are manufactured together in batches. Each wafer, within a lot, is processed at the same time and under the same conditions as all other wafers within the lot Each lot is assigned a unique serial number, called "Lot Number", or, "Lot ID". Within each lot, each wafer also contains a unique serial number and, within each wafer, each die has a serial number or x-y coordinate, indicative of its location on the wafer. A flow diagram summarizing the steps in the front-end processing of semiconductor devices is shown in FIG. 1. During this process, tests can be applied between steps to determine their effectiveness and to monitor the process.

After completion of the photo-chemical steps, each wafer is tested to determine which die are good and which are bad. The individual die are tested and the good ones are individually installed into plastic or ceramic packages or temporary carriers. The good die, installed into packages if appropriate, are then subjected to further tests to determine quality and insure reliability and then shipped to the end user. In the case where the die will be shipped bare (unpackaged), they are inserted into temporary carriers, that act as packages for the remainder of the process and then removed from these carriers prior to shipment.

Figure 2:
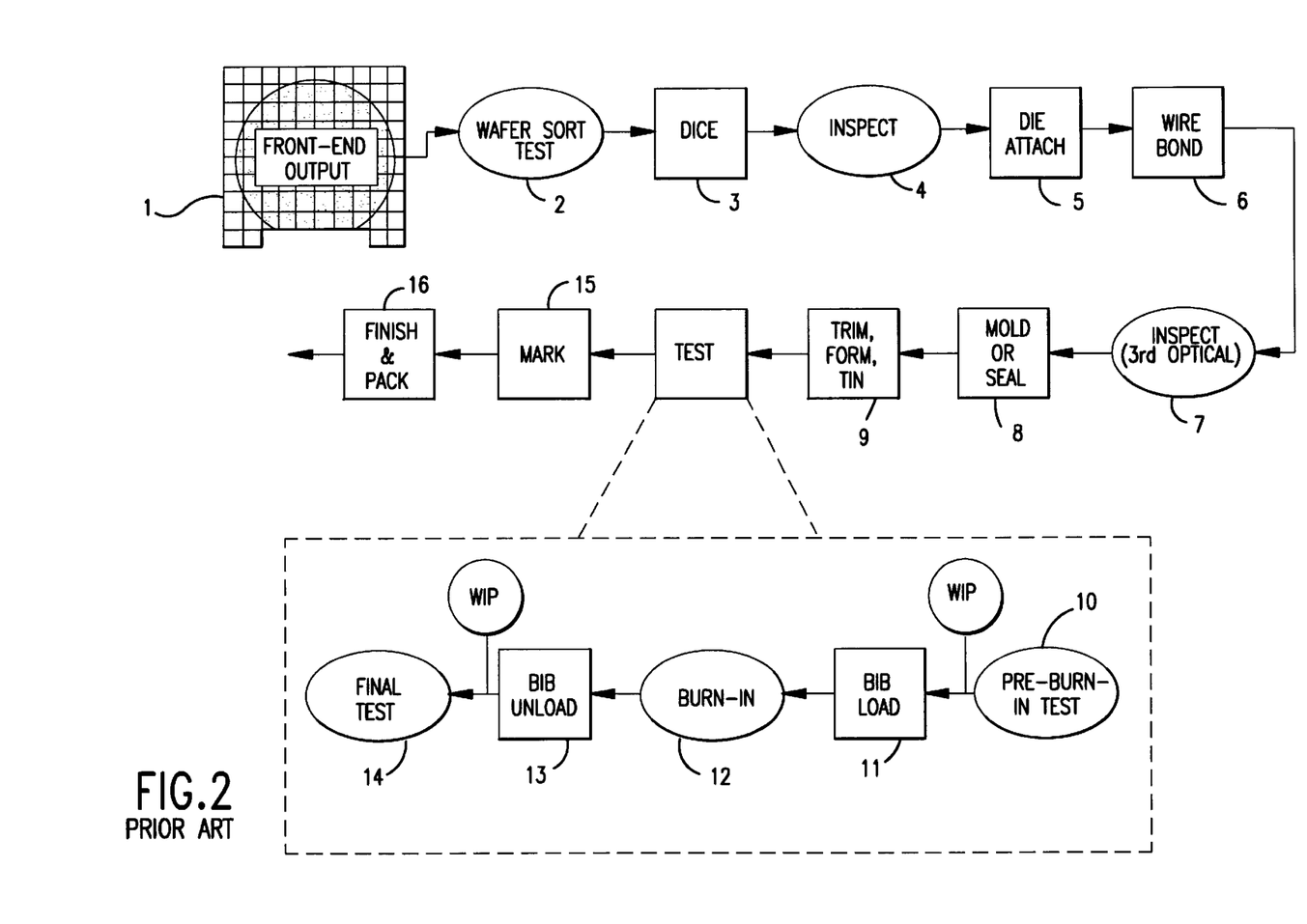
FIG. 2 shows a flow diagram summarizing the back-end of the semiconductor manufacturing process.

The series of tests and processes to which the good die are subjected are designed to insure quality, performance and, finally, mark and finish the unit before it is shipped to a customer. This is typically called the "back end" of the semiconductor process. In addition to testing and validating the quality of the individual units, the back-end steps provide information to the front end, where the die are fabricated, that is used to measure, control and improve the performance of the front-end process steps. FIG. 2 shows a flow diagram summarizing the back-end manufacturing process including the following steps (not all of which are necessarily present in every fab.):

(1) Front-End Output—untested wafers;
(2) Wafer Sort Test—identify good and bad die;
(3) Dice—saw or scribe the wafer into individual die attached to a sticky backing;
(4) Inspect (2nd Optical)—inspect for saw or scribe damage and probe and ink marks;
(5) Die Attach—separate good die from backing and attached to package, includes pad bond for flip-chip;
(6) Wire Bond—attach die pads to package pins, wire or TAB only;
(7) Inspect (3rd Optical)—inspect wire bond quality (height, spacing);
(8) Mold or Seal—encapsulate plastic package or attach lid on ceramic package;
(9) Trim, Form, Tin—trim shorting bars and form leads to desired shape;
(10) Pre-Burn-in Test—optional pre-screen test to screen bad die and monitor assembly defects;
(11) BIB Load—load devices into burn-in-board;
(12) Burn-in—powered, monitored, or test during burn-in;
(13) BIB Unload—load devices into trays;
(14) Final Test—final performance test;
(15) Mark—mark logo, part number, serial number etc. on package;
(16) Finish and Pack—attach heat sink and fan, if appropriate and pack for shipping.

When the wafers are tested, the percentage of good die out of the total number of die is called the "yield". Maximizing yield is of critical importance because it has a direct bearing on the manufacturer's profit. At each step in the process it is possible to introduce defects that lower yield. Therefore, manufacturers track the performance of their process by inspecting and testing after critical production process steps. It is desirable to correlate front-end inspection and test results to the lot, individual wafer and specific die on the wafer. This enables the manufacturer to identify process variation patterns that are indicative of faulty, or non-uniform, performance of the processing equipment or methods. However, after the die are separated from the wafer, in the back end, it is of extreme difficulty to maintain correlation to the lot, wafer and die location, because there is typically no marking on the individual die, or its package or carrier, that identifies the lot, wafer and location on the wafer, of the die. Since the marking of a device is reflective of the results of later test steps, the devices are not marked until the end of the manufacturing process and, therefore, there is no physical identification on the packaged device and no reliable method to maintain traceability of an individual unit. Without traceability throughout the entire process, much of the data that could be used to more rapidly bring a new process on line and/or fine tune a process for maximum yield, is lost.

This invention provides a means for the semiconductor manufacturer to write individual device specific information directly onto the carrier used to transport their products from step to step during the manufacturing process. These carriers may be wafer cassettes, device trays, tubes, reels, individual die carriers, or any other type of material carrier. The data storage device may be a semiconductor device such as a flash memory, eeprom, or any other type of non-volatile data-storage device. For greater simplicity and security in writing and reading from the device, it may be a simple controller with embedded user memory.

The manufacturing equipment used at each process step includes the apparatus for writing to the carrier's storage device and reading the data contained within that storage device. At the beginning of a process step, the data in the carrier's storage device will be read by the equipment to verify that the devices are at the correct location in the process and update the work-in-process data. The data that may be stored in the embedded, or attached, data storage device may include, but is not limited to: lot identification, wafer identification for each device in the carrier, the original location on the wafer for each device in the carrier, identification of specific process equipment used to manufacture each device, date and time stamps, operator identification for each process step, process step test or inspection results for each device, process steps completed, remaining life of the carrier and other data pertinent to each individual wafer, die, device and the carrier itself.

At the end of each step, the processing equipment updates the data contained in the storage device to reflect the results of that step on a device-by-device basis. In this manner, all process step and results data travel with the semiconductor devices being manufactured and provide the manufacturer with the ability to correlate all results with the specific product lot, wafer and location on the wafer.

Figure 3:
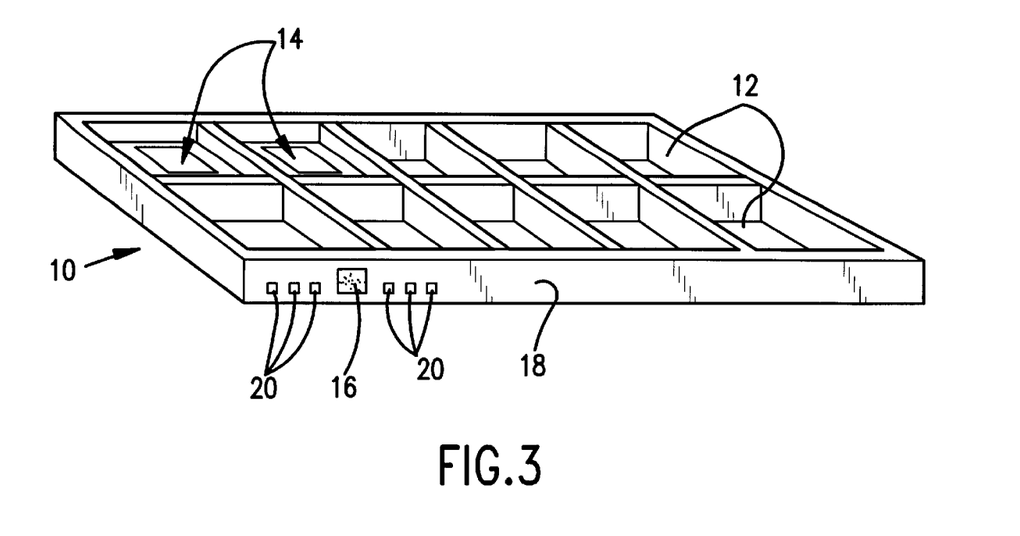
FIG. 3 shows a tray according to an embodiment of the invention.

FIG. 3 shows one embodiment of the invention in the form of a tray used in the back-end semiconductor manufacturing process. The tray comprises a molded plastic body 10 having a number of compartments 12, each of which receives a packaged die 14 (only two are shown). The tray is used to transport the dies 14 between processing or testing steps, the dies being withdrawn from the compartment and processed or tested. The dies are then placed in the compartments of another, similar carrier. An electronic memory device 16 is encapsulated within the sidewall 18 of the tray and electrical contacts 20 are present at the surface of the sidewall 18 to allow power and data communication between the device 16 and a reader (not shown). The device 16 and contacts 20 are essentially the same as those used in "smart card"-type devices. The device includes a memory which holds data and a controller for communicating data with a reader and providing power to the device via the contacts. The data stored in the memory are correlated with the positions of the compartments. Therefore, when a die is placed in one compartment of the tray, the data relating to that die are read into the memory for that compartment location. When a die is removed from a compartment, the data in the memory relating to that compartment are read into the processing or testing equipment or the computer used to control such equipment to provide the appropriate data for that die.

Figure 4:
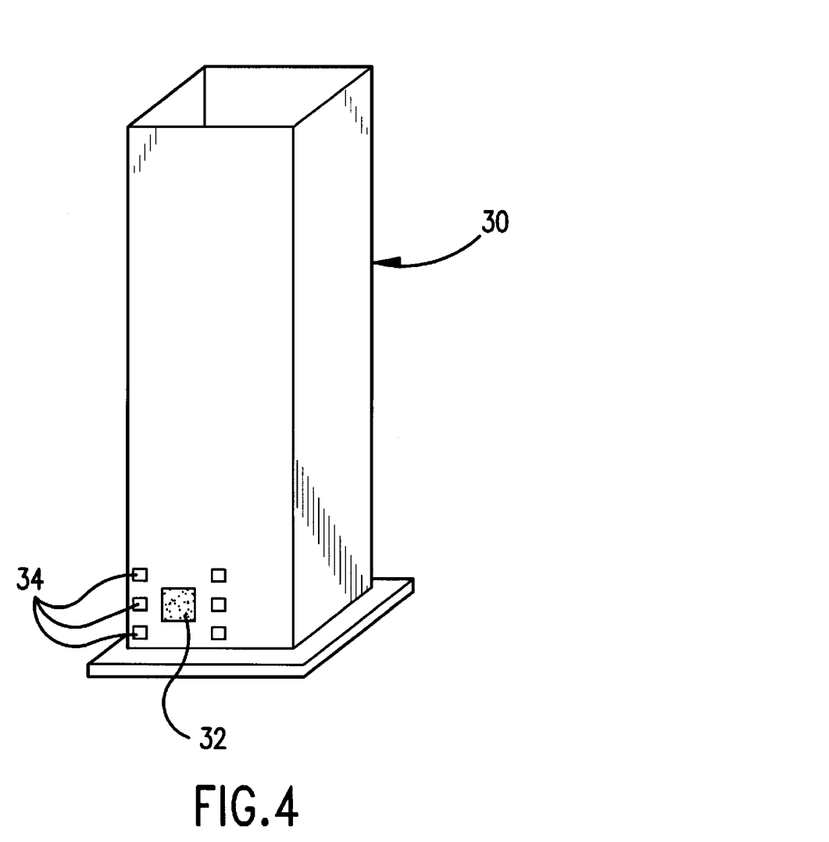
FIG. 4 shows a tube for carrying large devices according to an embodiment of the invention.

FIG. 4 shows a tube for large packaged parts in accordance with another embodiment of the invention. In this case, the packaged dies are located one on top of the other in a single molded tube 30 rather than in individual compartments. An electronic memory device 32 is formed with contacts 34 the wall of the tube 30 in the same manner as shown in the tray of FIG. 3.

Figure 5:
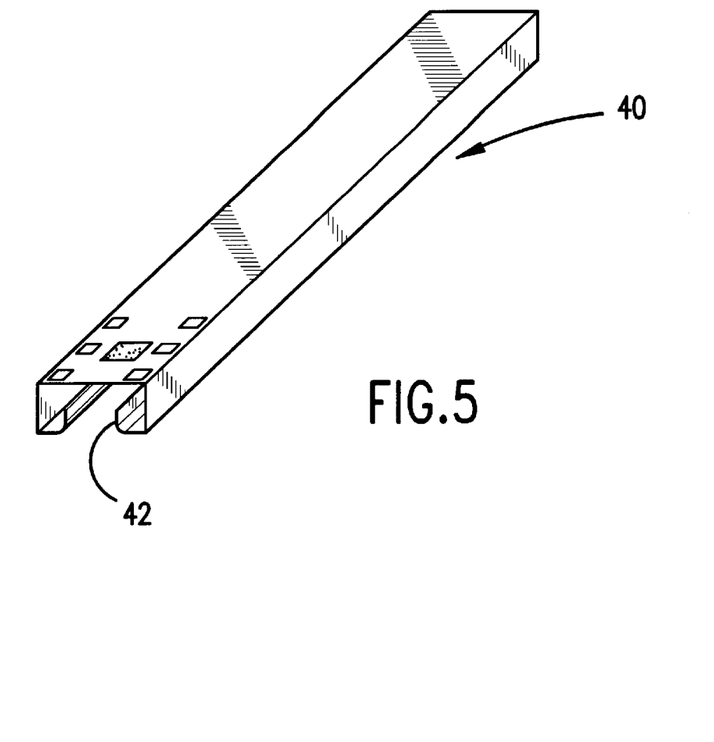
FIG. 5 shows a tube for carrying small devices according to an embodiment of the invention.

FIG. 5 shows a tube for carrying smaller devices than that of FIG. 4. In this case, the tube comprises an elongate, flattened, plastic tube 40 with a slot 42 extending along one side. The dies (not shown) are placed in a side-by-side relationship in this tube.

Figure 6:
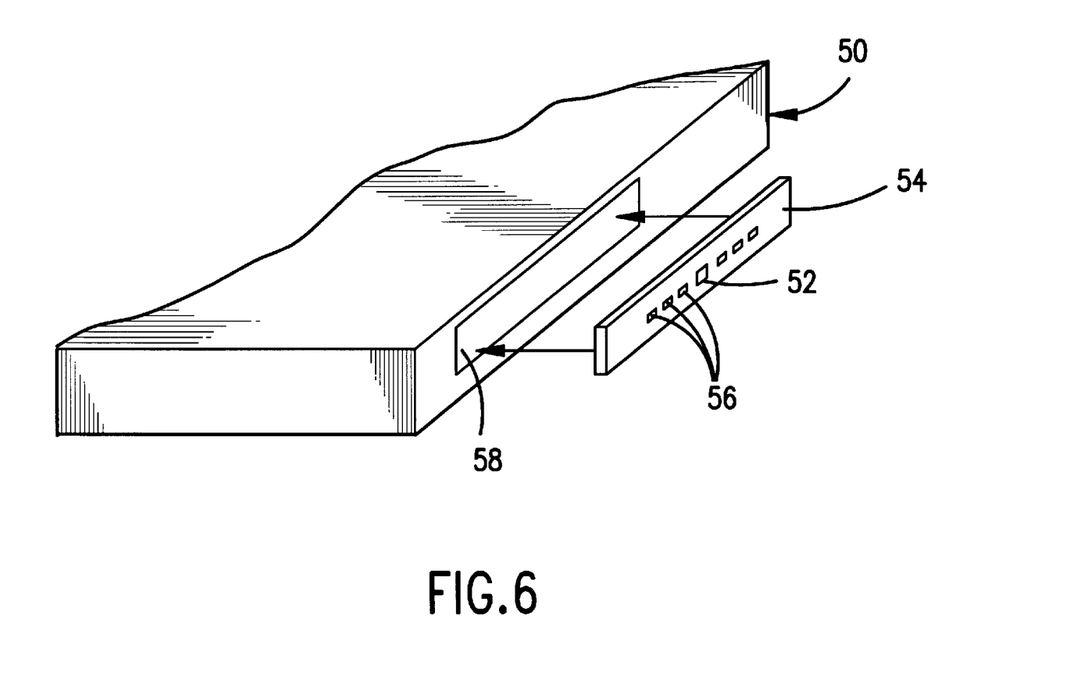
FIG. 6 shows a partial view of a tray according to an embodiment of the invention.

FIG. 6 shows a part view of a tray 50 similar to that shown in FIG. 3. In this tray, the memory device 52 is not formed integrally with the tray but is formed in a strip 54 together with the contacts 56. The strip 54 may be located in a recess 58 formed in the wall of the tray and can be secured therein by adhesive, plastics welding, snap fit or any other suitable means which will retain the strip 54 in the recess 58 during the semiconductor manufacturing process. Alternatively the strip 54 can be mounted on the surface of the tray wall (not shown).

Figure 7:
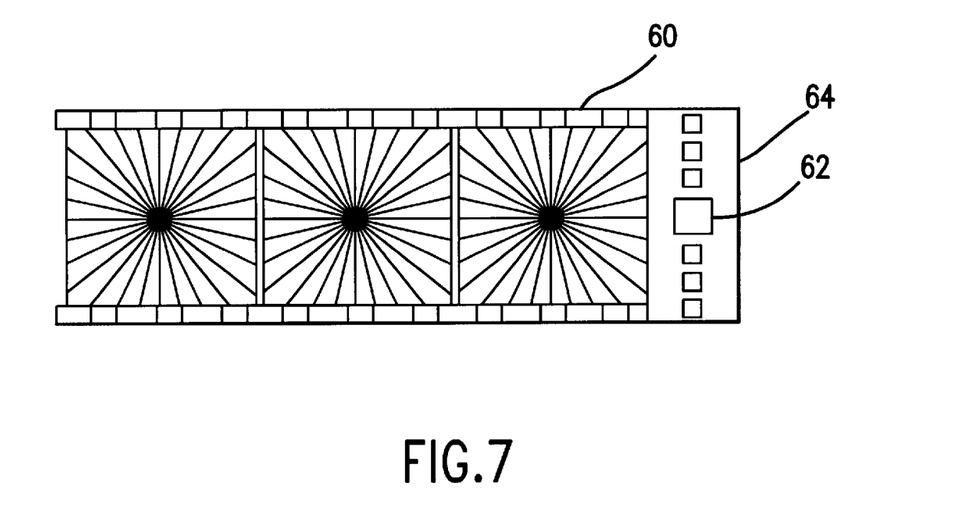
FIG. 7 shows a lead frame according to an embodiment of the invention.

FIG. 7 shows a series of dies connected in a side-by-side relationship in a lead frame 60. A memory device with contacts 62 is provided in a tab 64 attached to one end of the lead frame. The tab is essentially similar to the strip 54 described above in relation to FIG. 6.

Figure 8:
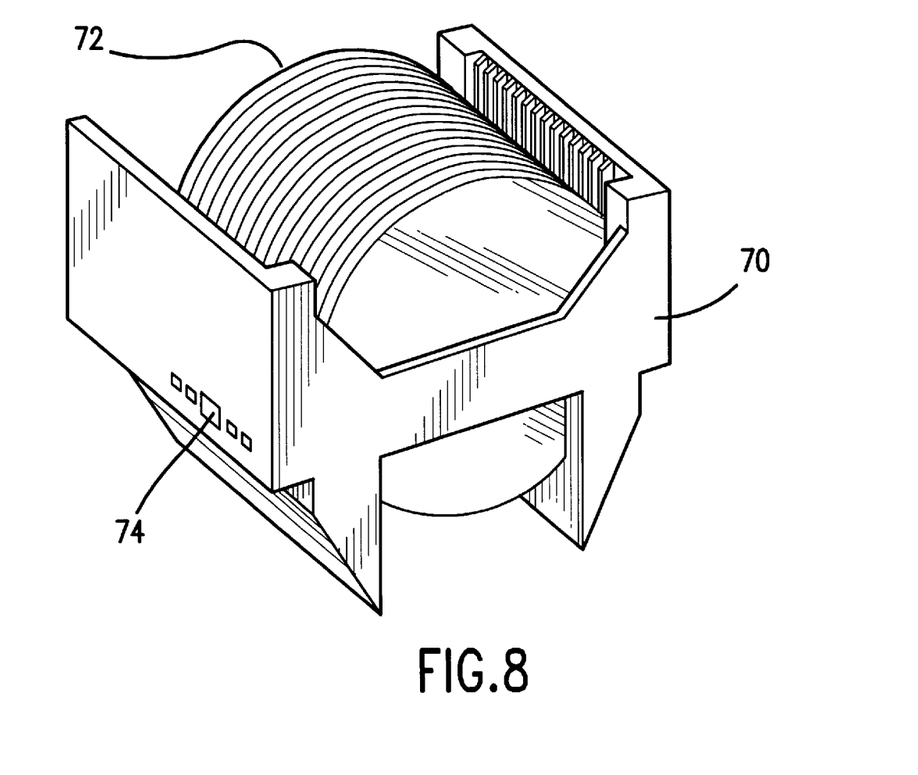
FIG. 8 shows a wafer cassette according to an embodiment of the invention.

While the invention has been described above in relation to FIGS. 3 to 7 for carriers used in the back-end manufacturing process, it also has application in the front-end. FIG. 8 shows a wafer cassette 70 which is used to carry wafers 72 between the various processing stages in manufacture. The memory device 74 is formed in or attached to the side of the cassette in the same manner as described above in relation to trays.

Figure 9:
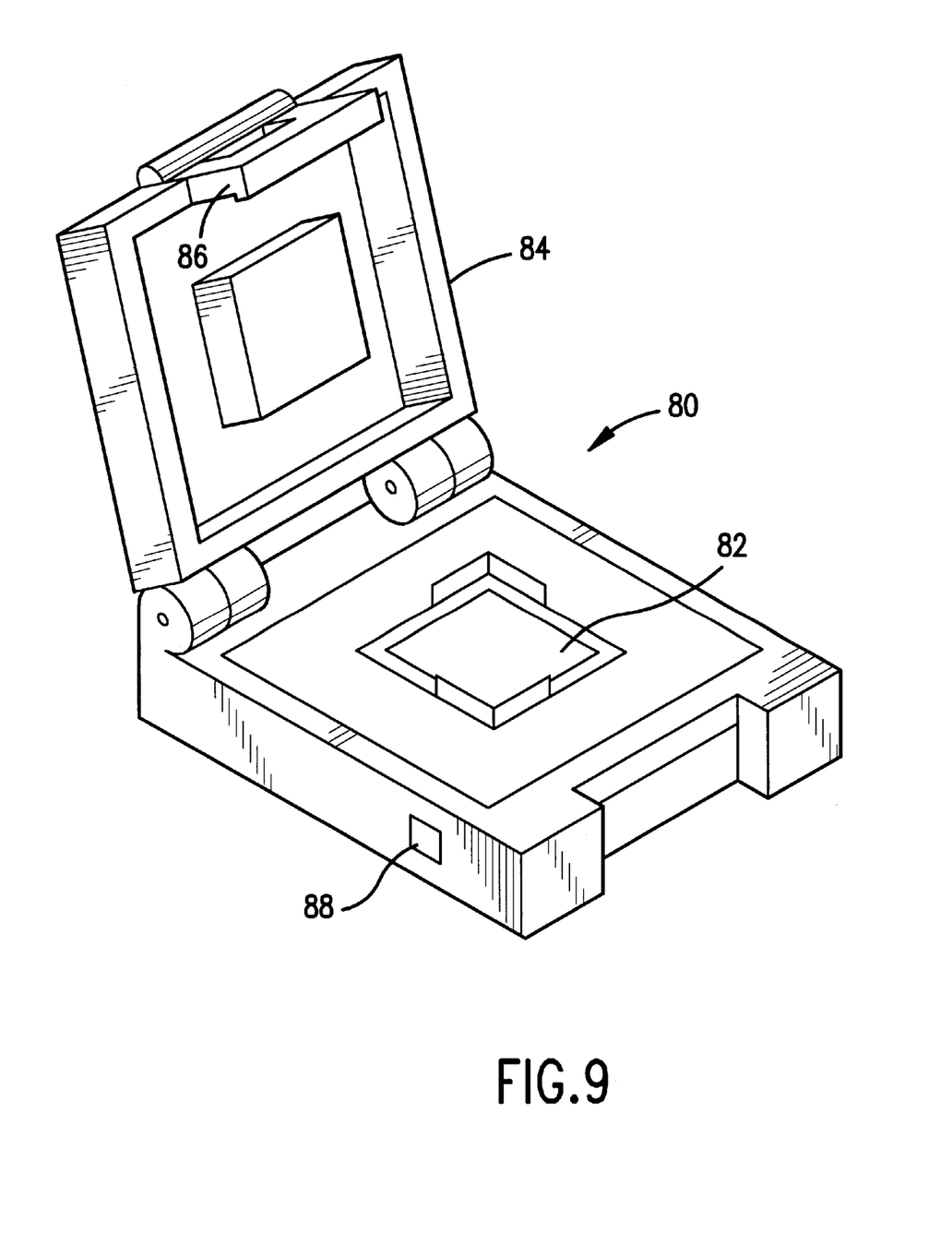
FIG. 9 shows a socket for a bare die according to an embodiment of the invention.

It is sometimes desirable to ship bare, unpackaged dies individually between manufacturing processes or to the end user. In such cases, each die is located in its own socket. A socket in accordance with the invention is shown in FIG. 9 and comprises a plastic two-part container 80 having a base with a locating recess 82 for the die (not shown) and a hinged lid 84 with a catch 86. A memory device 88 is embedded in the base. No contacts are present here as communication is via an r.f. link using an inductive loop in the device 88 (a "contactless" device). This type of communication can be used for the embodiments described in place of the contact devices described. Likewise, the socket can be provided with contacts if desired.

Figure 10:
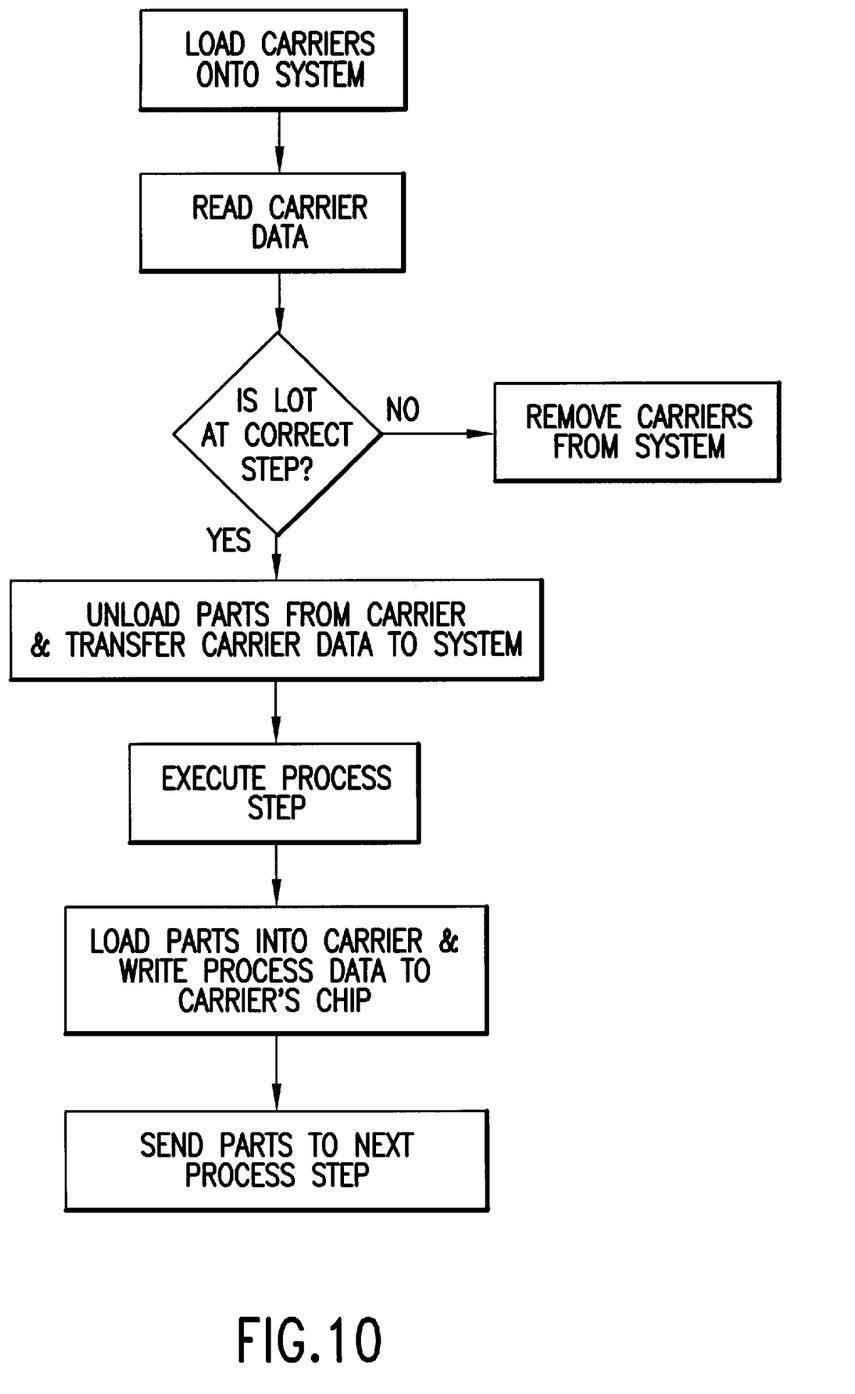
FIG. 10 shows a flow diagram of the operation of a system according to the invention.
Figure 11:
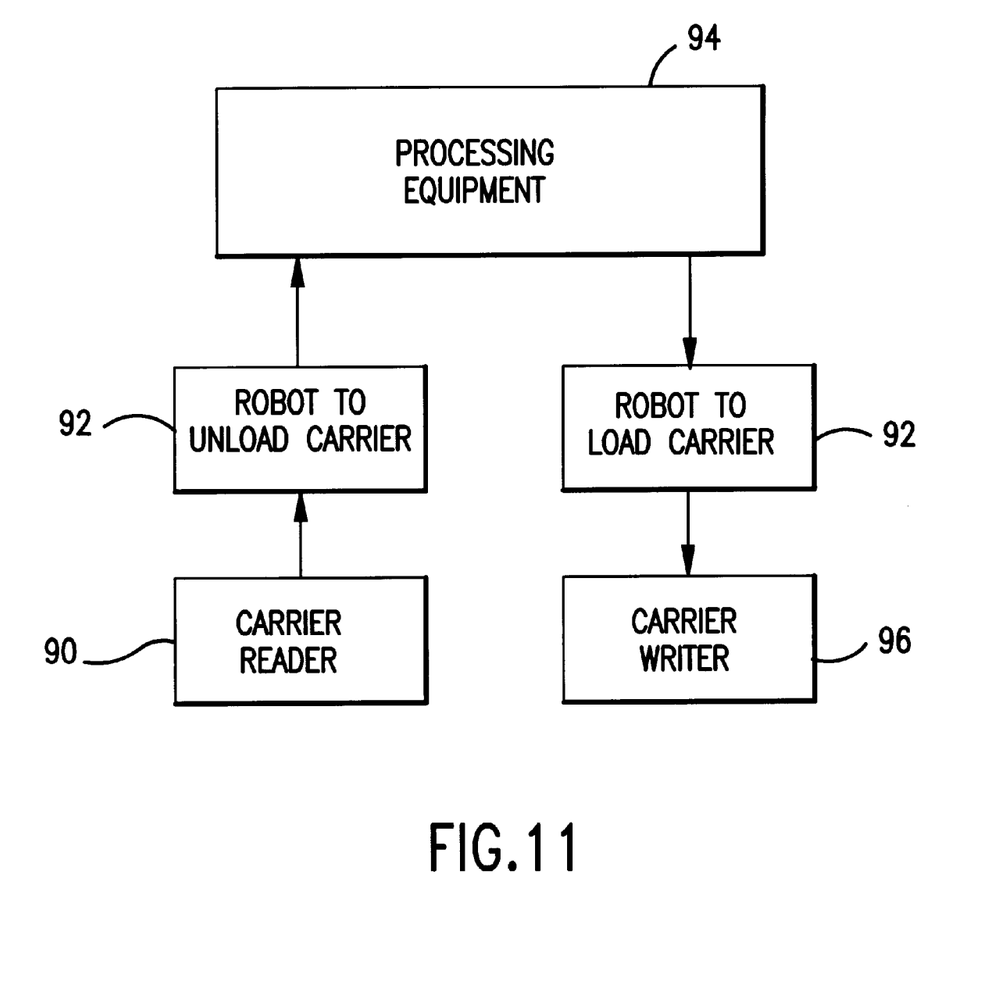
FIG. 11 shows a diagram of a processing equipment for use in the system of FIG. 10.

The operation of a system according to the invention is shown in FIGS. 10 and 11 and comprises the following steps:

(i) Carriers (trays tubes etc. as shown in FIGS. 3–9) containing the IC devices are loaded into the system;

(ii) The data in the information storage device on each carrier is read by a reader 90;

(iii) The data is checked to ensure that the lot from which the devices originate are at the correct step in the manufacturing process, if not the carrier is removed from the system;

(iv) If at the correct stage, the devices (parts) are removed from the carrier by means of a robot 92 and carrier data is transferred to the processing equipment 94;

(v) The processing step is executed in the processing equipment 94;

(vi) After processing is finished, the parts are loaded back into the carrier by a robot 92 and process data is written into the information storage device by a writer 96;

(vii) The carrier is transferred to the next process step.

At any stage during or after processing or transfer between processing steps, the carrier data can be read into a central processing unit and analyzed to monitor progress of the parts through the manufacturing process and to identify potential problems in the process which can be corrected before the next lot of devices is processed.

I claim:

1. Apparatus for carrying and providing traceability for semiconductor die during and after wafer processing, comprising:

a) a structure for receiving at least one semiconductor die; and b) an electronic information storage device fixed to the structure and including:
   A. a memory which stores traceability data associated with each semiconductor die, and
   B. means for allowing the traceability data for the semiconductor die, to be electronically read from and written to the memory.

2. Apparatus as claimed in claim 1, wherein the structure receives a plurality of die.

3. Apparatus as claimed in claim 2, wherein the structure comprises a plurality of discrete sites, each for receiving an individual die.

4. Apparatus as claimed in claim 1, wherein the structure is selected from the group consisting of trays, tubes, lead frames, wafer cassettes and die sockets.

5. Apparatus as in claim 1, wherein the means for allowing traceability data to be read and written comprises at least one electrical connection terminal at a surface of the structure accessible to a read/write device.

6. Apparatus as in claim 1, wherein the means for allowing traceability data to be read and written comprises an inductive loop beneath a surface of the structure.

7. Apparatus as claimed in claim 1, wherein the electronic information storage device is formed integrally with the structure.

8. Apparatus as claimed in claim 1, wherein the electronic information storage device is formed separately from the structure and located securely thereon.

9. Apparatus as claimed in claim 1, wherein the traceability data stored in the memory comprises data identifying the die and data indicative of the process steps undergone by the die during its manufacture.

10. Apparatus as claimed in claim 9, wherein the traceability data are selected from the group consisting of lot identification, wafer identification, original location of a die on a wafer, identification of specific equipment used to manufacture the semiconductor device, date stamps, time stamps, operator identification for manufacturing process steps, manufacturing process step test and inspection results for the semiconductor device, manufacturing process steps completed and remaining life of the carrier.

11. An apparatus for carrying and providing traceability for semiconductor die at the back end of the semiconductor manufacturing process, after separation from an originating wafer has occurred, comprising:
   a) a die carrier for receiving at least one semiconductor die, separately from the originating wafer; and
   b) an electronic information storage device fixed to the die carrier and including:
      A. a memory which stores data associated with the semiconductor die, and
      B. a means for allowing data, including traceability data for the semiconductor die, to be electronically read from and written to memory.

12. An apparatus as in claim 11, wherein the traceability data includes identification of the originating wafer.

13. An apparatus as in claim 11, wherein the die carrier receives a plurality of semiconductor die, at least two of the semiconductor die having different traceability data.

14. An apparatus as in claim 1, wherein the traceability data includes identification of the wafer from whence the semiconductor die originated.

15. An apparatus as in claim 1, wherein the structure receives a plurality of semiconductor die, at least two of the semiconductor die having different traceability data.

* * * * *